(12) United States Patent
Klee et al.

(10) Patent No.: US 9,440,258 B2
(45) Date of Patent: Sep. 13, 2016

(54) THIN FILM ULTRASOUND TRANSDUCER

(75) Inventors: Mareike Klee, Straelen (DE); Ruediger Mauczok, Erkelenz (DE); Henri Marie Joseph Boots, Best (NL); Nico Maris Adriaan De Wild, Eindhoven (NL); Biju Kumar Sreedharan Nair, Veldhoven (NL); Olaf Wunnicke, Eindhoven (NL); Willem Franke Pasveer, Dordrecht (NL); Dirk Van De Lagemaat, Hoevelaken (NL); Peter Dirksen, Valkenswaard (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 781 days.

(21) Appl. No.: 13/812,640

(22) PCT Filed: Jul. 12, 2011

(86) PCT No.: PCT/IB2011/053096
§ 371 (c)(1),
(2), (4) Date: Apr. 5, 2013

(87) PCT Pub. No.: WO2012/014111
PCT Pub. Date: Feb. 2, 2012

(65) Prior Publication Data
US 2013/0208572 A1 Aug. 15, 2013

(30) Foreign Application Priority Data

Jul. 30, 2010 (EP) .................................... 10305849
Jun. 14, 2011 (EP) .................................... 11305741

(51) Int. Cl.
*B06B 1/06* (2006.01)

(52) U.S. Cl.
CPC ............... *B06B 1/06* (2013.01); *B06B 1/0622* (2013.01); *B06B 1/0688* (2013.01)

(58) Field of Classification Search
USPC ........................................................ 367/180
See application file for complete search history.

(56) References Cited

U.S. PATENT DOCUMENTS

| 5,495,137 A | 2/1996 | Park |
| 6,323,580 B1 | 11/2001 | Bernstein |

(Continued)

FOREIGN PATENT DOCUMENTS

| CN | 2796747 Y | 7/2006 |
| JP | 02238799 A | 9/1990 |

(Continued)

*Primary Examiner* — James Hulka

(57) ABSTRACT

The present invention relates to a transducer (11) comprising—a membrane (31) configured to change shape in response to a force, the membrane (31) having a first major surface (16) and a second major surface (17), —a piezoelectric layer (18) formed over the first major surface (16) of the membrane (31), the piezoelectric layer (18) having an active portion, —first and second electrodes (19) in contact with the piezoelectric layer (18), wherein an electric field between the first and second electrodes (19) determines the mechanical movement of the piezoelectric layer (18), —support structures (40) at the second major surface (17) of the membrane (15) on adjacent sides of the active portion of the piezoelectric layer (18), at least part of the support structures (40) forming walls perpendicular, or at least not parallel, to the second major surface (17) of the membrane (31), so as to form a trench (41) of any shape underlying the active portion, so that an ultrasound transducer is obtained with a high output pressure at the support side than at the opposite side. The invention also relates to a method of forming such a transducer, and an array comprising at least one transducer of the like.

19 Claims, 14 Drawing Sheets

(56) References Cited

U.S. PATENT DOCUMENTS

| | | | |
|---|---|---|---|
| 6,515,402 B2 | 2/2003 | Schlenker | |
| 6,548,937 B1 | 4/2003 | Klee | |
| 7,098,574 B2 * | 8/2006 | Iwata | H03H 3/04 |
| | | | 310/320 |
| 7,466,064 B2 * | 12/2008 | Sugiura | B06B 1/0692 |
| | | | 310/324 |
| 7,498,716 B2 * | 3/2009 | Watanabe | B41J 2/14209 |
| | | | 310/317 |
| 7,730,785 B2 * | 6/2010 | Wado | B60B 1/0688 |
| | | | 310/311 |
| 2005/0013457 A1 * | 1/2005 | Sheplak | G10K 11/172 |
| | | | 381/338 |
| 2006/0043843 A1 * | 3/2006 | Sugiura | B06B 1/0629 |
| | | | 310/348 |
| 2006/0186762 A1 * | 8/2006 | Sugiura | B06B 1/0692 |
| | | | 310/328 |
| 2007/0251324 A1 | 11/2007 | Wado | |
| 2009/0295876 A1 * | 12/2009 | Kobayashi | C23C 30/00 |
| | | | 347/71 |

FOREIGN PATENT DOCUMENTS

| | | |
|---|---|---|
| JP | 03125597 A | 5/1991 |
| JP | 2003143696 A | 5/2003 |
| JP | 2005051689 A | 2/2005 |
| JP | 2009118093 A | 5/2009 |
| JP | 2010164331 A | 7/2010 |
| WO | 0138011 A1 | 5/2001 |
| WO | 2009004558 A2 | 1/2009 |

* cited by examiner

THIN FILM ULTRASOUND TRANSDUCER

FIELD OF THE INVENTION

The present invention relates to the field of transducers and more specifically to ultrasound transducers including thin film ultrasound transducers and transducer arrays. The present invention relates to ultrasound transducers, which can also be used for presence detection for e.g. in buildings for lighting control, for air conditioning control, for safety and security, for activity sensing. The transducer arrays can also be used for proximity detection covering e.g. positioning of e.g. mobile phones, or for navigation of e.g. robotics, or for distance measurements in numerous applications such as parking aid, collision avoidance, or for gesture control in user interfaces or for flow sensing or for CO2 sensing or for tracking based on ultrasound or also ultrasound imaging including medical imaging. In embodiments of the present invention, a process and design of ultrasound transducers and transducer arrays is disclosed which enables to realize ultrasound thin film transducer arrays which show enhanced output pressure on a small size, flat, compact, low cost array.

BACKGROUND OF THE INVENTION

Ultrasound transducers are finding wide applications such as sensors for motion and presence detection. An ultrasound transducer is a device that converts electrical energy into mechanical energy. Most often, the term ultrasound transducer is used for referring to piezoelectric transducers that convert electrical energy via piezoelectricity into ultrasound. Piezoelectric crystals and piezoelectric ceramics have the property of changing size when an electrical signal is applied, thus applying an alternating electrical signal causes them to oscillate. The resonance frequency of the devices is dependent on the dimensions and the build-up of device. Since piezoelectric crystals or ceramics generate an electrical signal when a mechanical force is applied to them, the same crystal or ceramic can be used as an ultrasound transmitter and as an ultrasound receiver.

WO 2009/004558 describes a transducer where a membrane is formed over a front substrate, and a piezoelectric layer is formed over the membrane at an active portion and peripheral portions located adjacent the active portion. A patterned conductive layer including first and second electrodes is formed over the piezoelectric layer. Further, a back substrate structure is provided having supports located at the peripheral portions adjacent the active portion. The height of the supports is greater than a combined height of the patterned piezoelectric layer and the patterned conductive layer. Many transducers may be connected to form an array.

SUMMARY OF THE INVENTION

It is an object of embodiments of the present invention to provide an ultrasound transducer as well as an array of transducers with high output pressure, small size, flat compact enabling in high volume production low cost.

The above objective is accomplished by a method and device according to the present invention.

In the present invention a process and design of ultrasound transducer arrays has been invented which enables to realize ultrasound thin film transducer arrays which show enhanced output pressure from a small size, flat, compact low cost array.

A special feature of an ultrasound transducer or an ultrasound transducer array according to embodiments of the present invention is that the devices show a higher output on the side of the membranes connected to the substrate than on the opposite side. The output pressure measured is a factor of 1.5 to 2.0 and even higher on the side of the membranes connected to the substrate than on the opposite side.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

To prevent cross talk between the ultrasound transducer elements in the package separation parts are implemented in the package between each element opposite to the support 40. They can be realised from inorganic or organic materials.

Figure 8A:
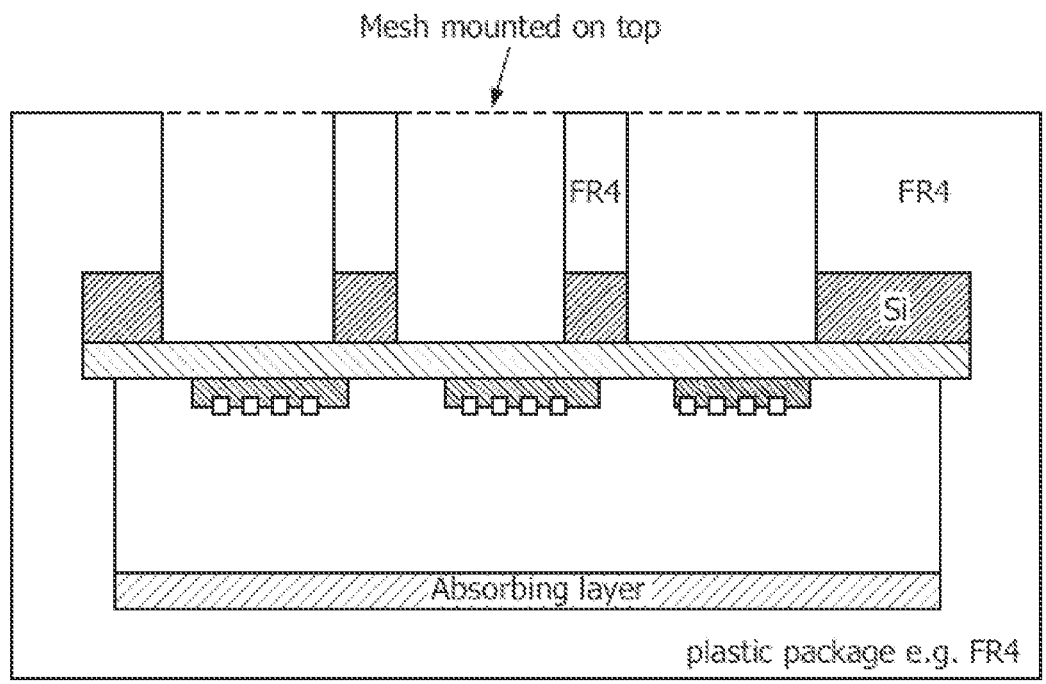
FIG. 8a shows an ultrasound transducer array along the present invention, where the transducer array is implemented in a plastic package. In this special package the support 40 is partly realised from Si and partly build up from the plastic material in the package. In the plastic package optionally an absorbing layer can be implemented. For damage protection of the transducer a mesh can be applied on top of the package.
Figure 8B:
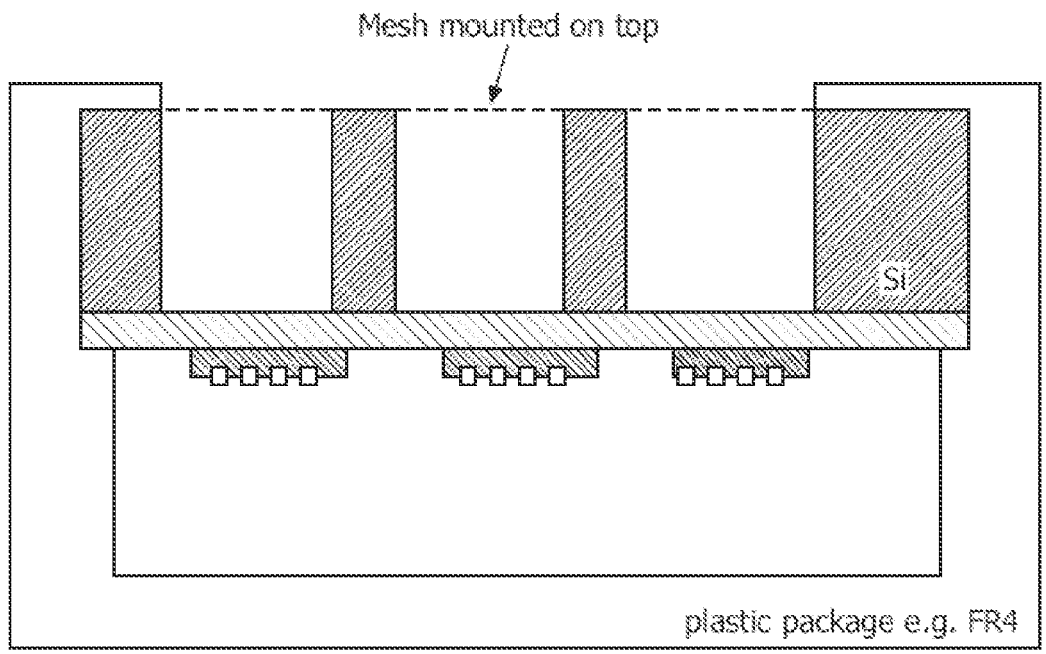
FIG. 8*b* shows an ultrasound transducer array along the present invention, where the transducer array is implemented in a plastic package. In this special package the support 40 is realised in Si. In the plastic package optionally an absorbing layer can be implemented. For damage protection of the transducer a mesh can be applied on top of the package.
Figure 8C:
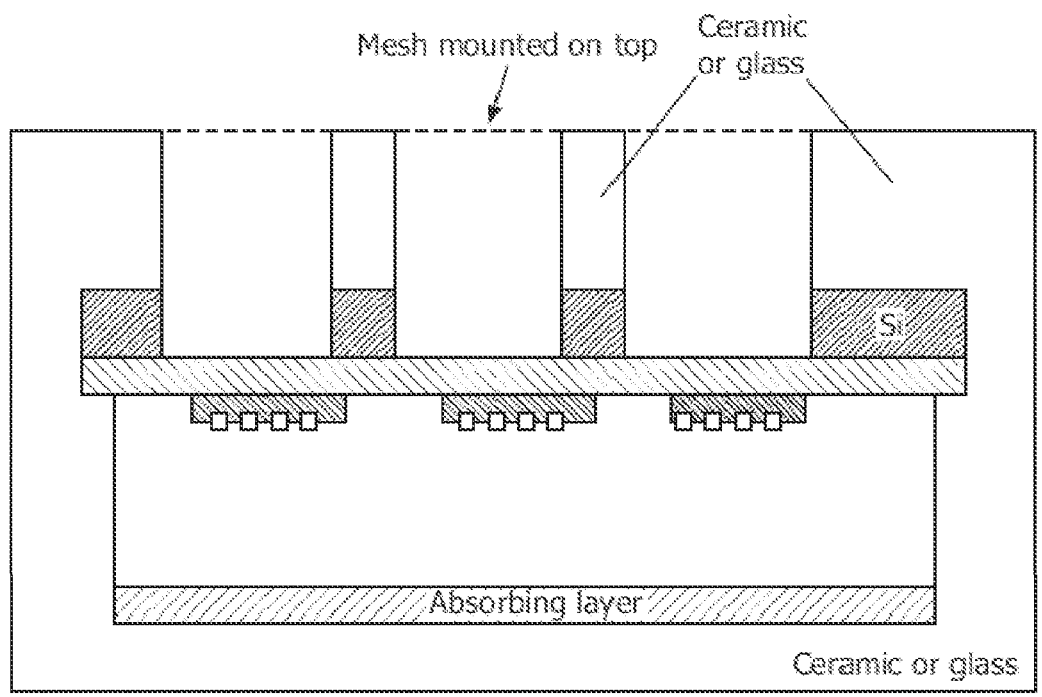

FIG. 8*c* shows an ultrasound transducer array along the present invention, where the transducer array is implemented in a ceramic or glass package. In this special package the support 40 is partly realised from Si and partly build up from the ceramic or glass material in the package. In the plastic package optionally an absorbing layer can be implemented. For damage protection of the transducer a mesh can be applied on top of the package.

Figure 8D:
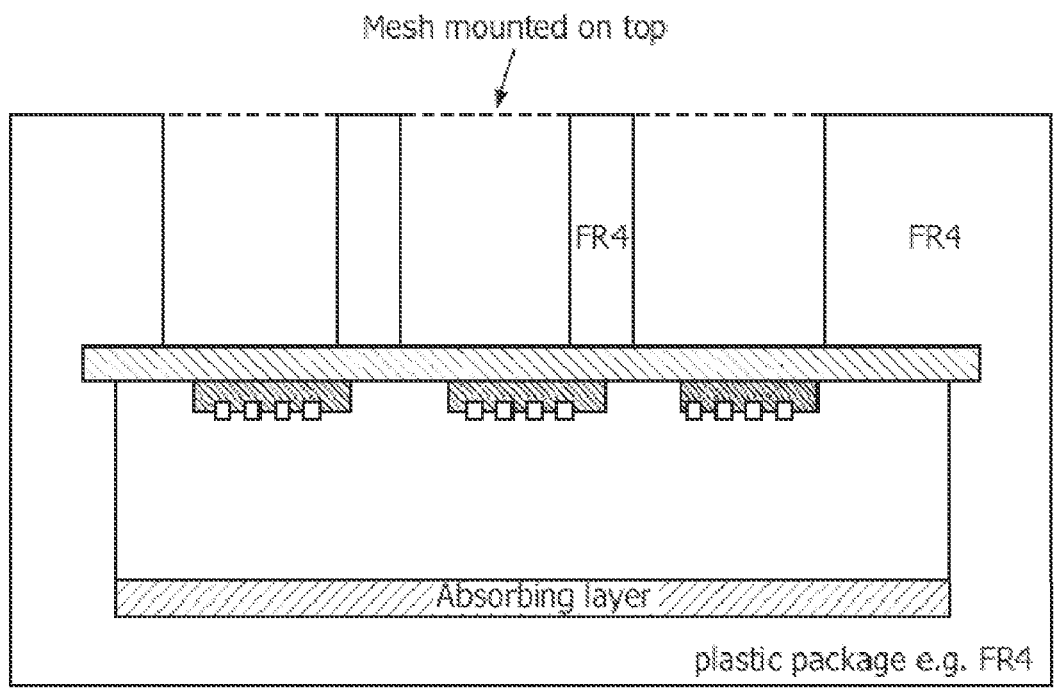

FIG. 8*d* shows an ultrasound transducer array along the present invention, where the transducer array is implemented in a plastic package. In this special package the support 40 is fully realised from a plastic material. In the plastic package optionally an absorbing layer can be implemented. For damage protection of the transducer a mesh can be applied on top of the package.

Figure 9A:
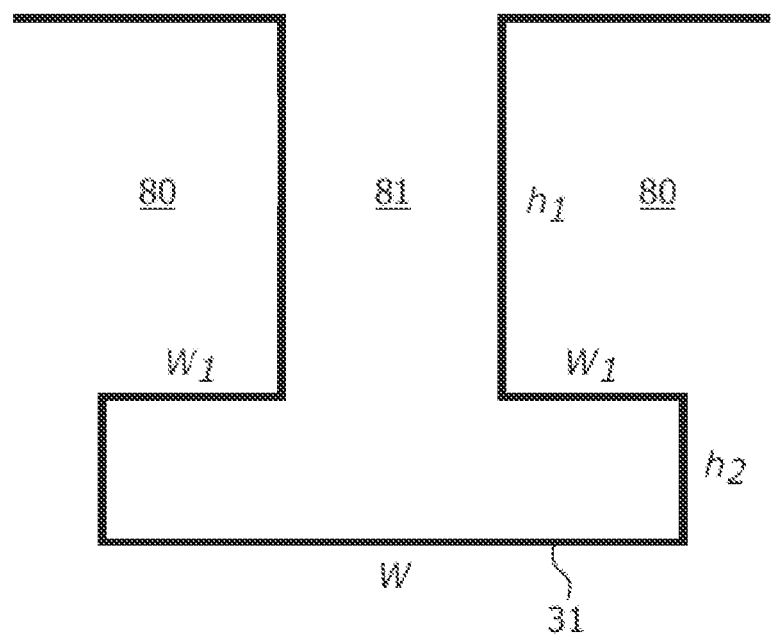

FIG. 9*a* is a basic illustration of an ultrasound transducer with in a structured trench in accordance with embodiments of the present invention.

Figure 9B:
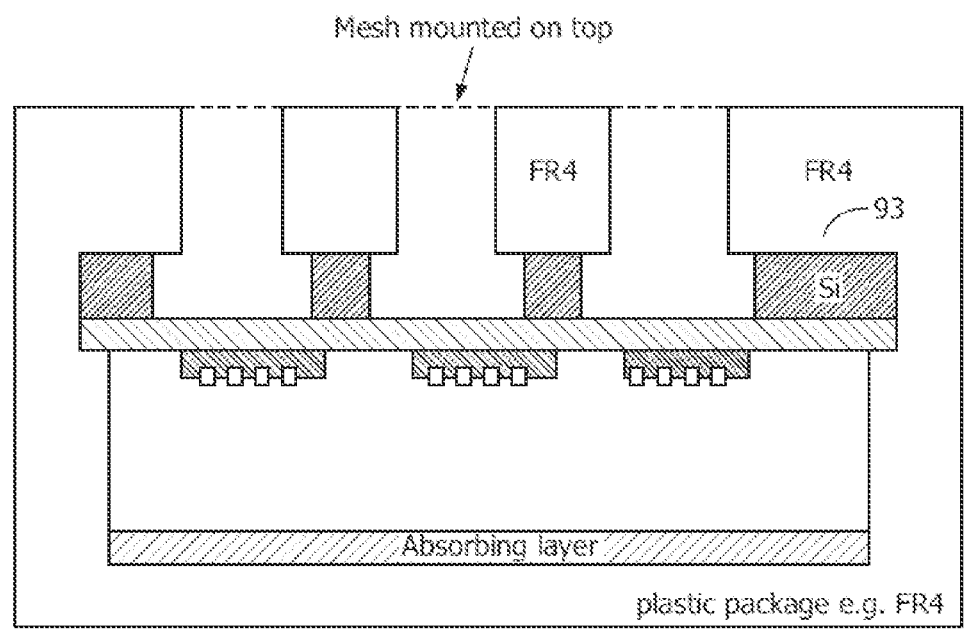

FIG. 9*b* shows an ultrasound transducer array along the present invention, where the transducer array is implemented in a plastic package. In this special package the structured support 40 is partly realised from Si and partly build up from the plastic material in the package. In the plastic package alternatively an absorbing layer can be implemented. For damage protection of the transducer a mesh can be applied on top of the package.

Figure 10:
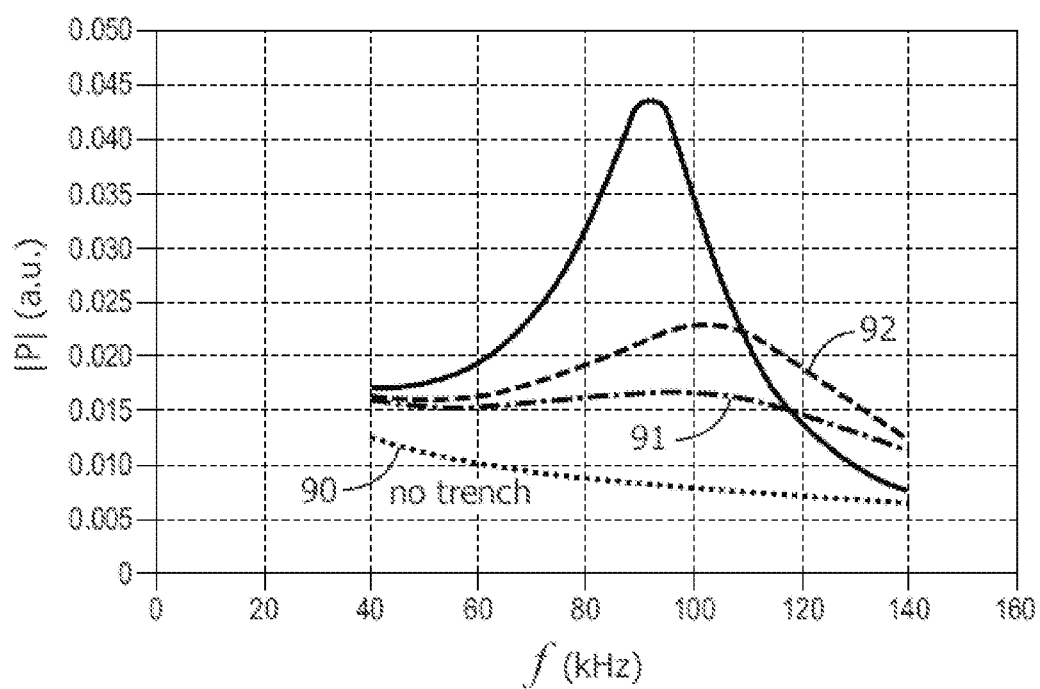

FIG. 10 is a graph illustrating pressure for the structured trench sketched in FIG. 9*a* with a width of the transducer of w=0.8 mm, in function of depth h1 of the trench, and in function of the value of w1.

Figure 11:
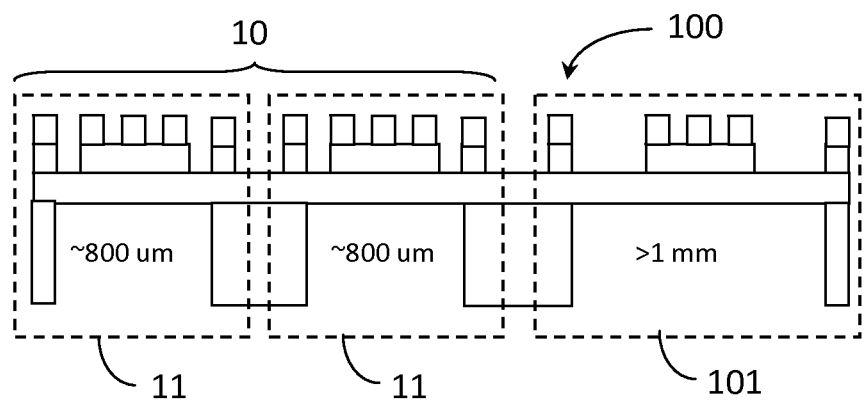

FIG. 11 is a schematic illustration of a multi-sensor according to embodiments of the present invention comprising an ultrasound transducer array and at least one microphone integrated in the same technology.

Figure 12:
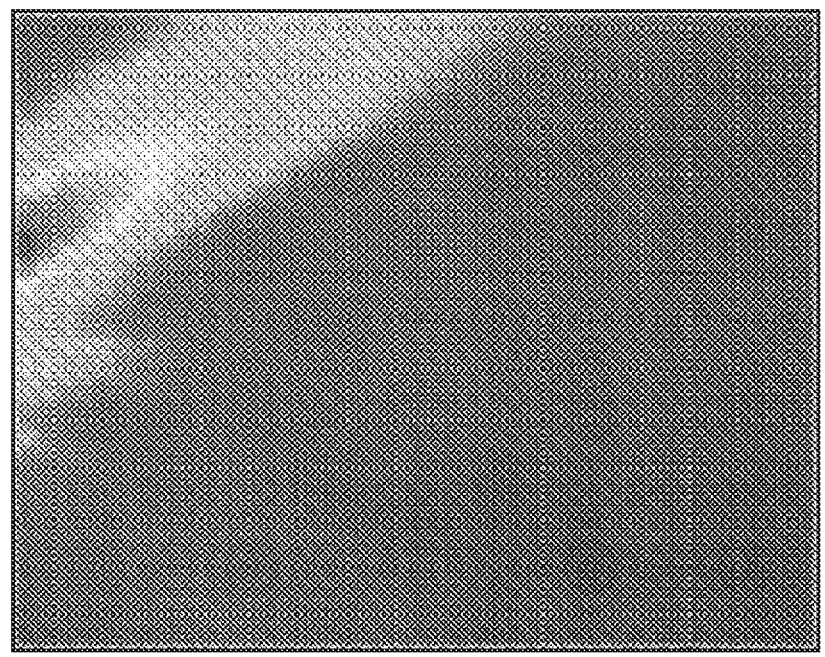

FIG. 12 illustrates the result of beam steering according to embodiments of the present invention.

Figure 13:
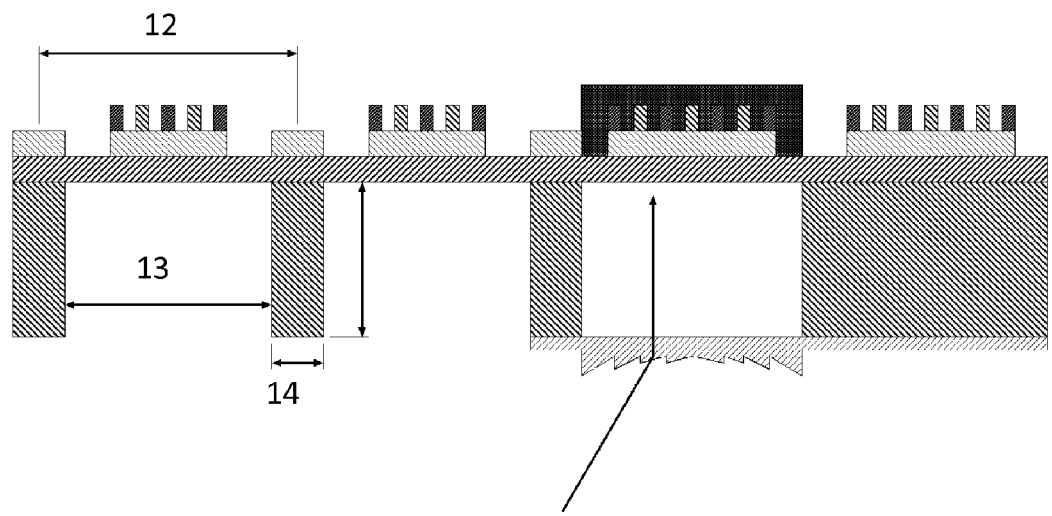

FIG. 13 is a schematic illustration of a multi-sensor according to embodiments of the present invention comprising an ultrasound transducer array and at least one pyroelectric sensor integrated.

Figure 14:
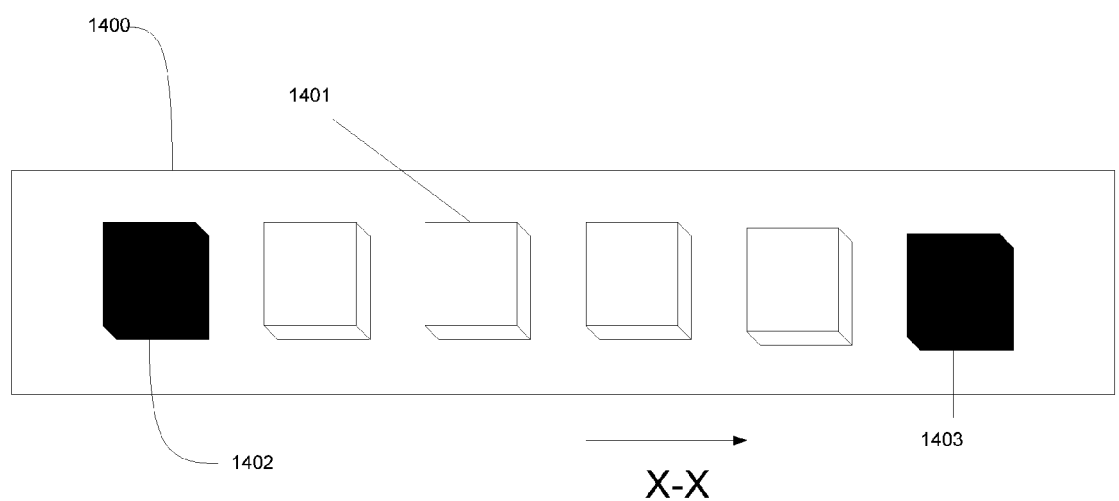
Figure 15A:
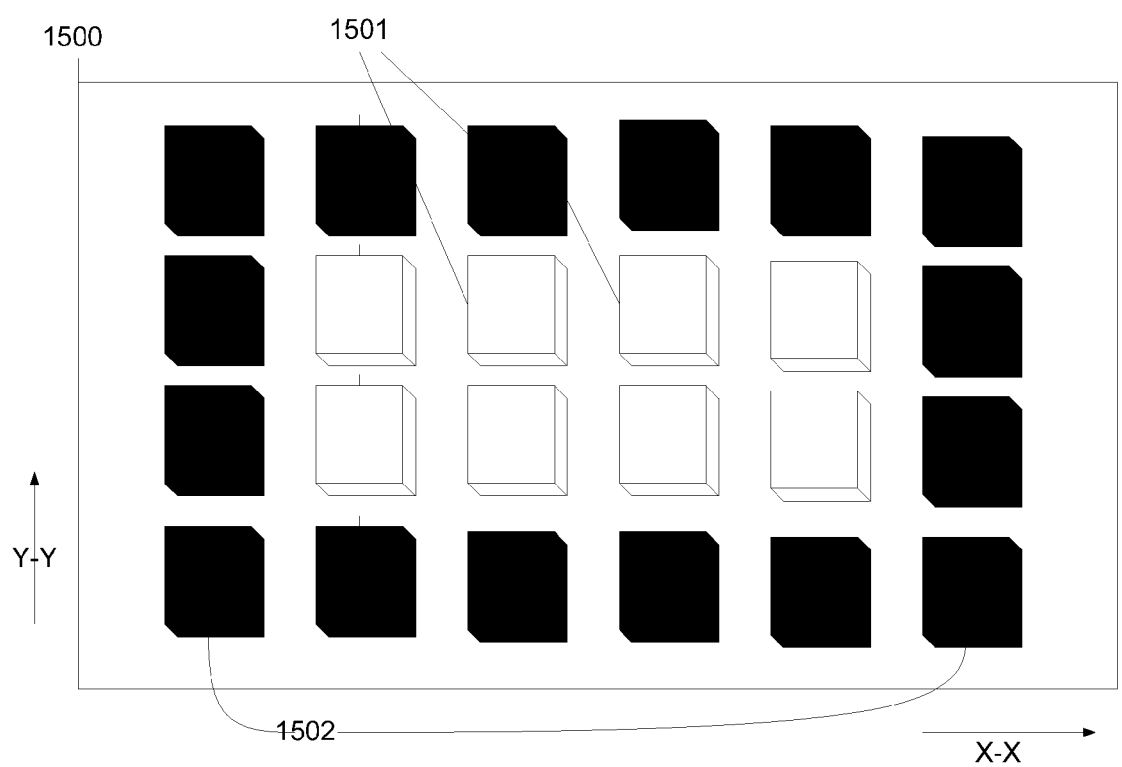
Figure 15B:
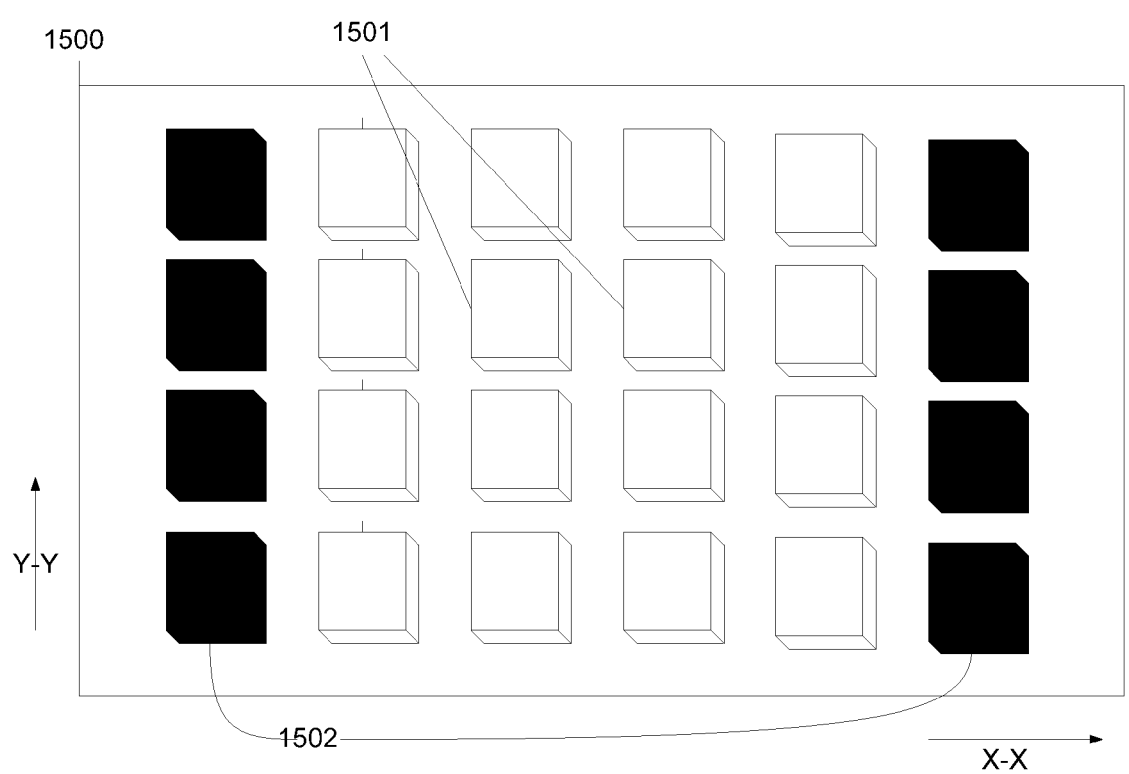

FIG. 14 is a schematic illustration of a first example of a multi-sensor according to an alternative embodiment of the invention;

FIGS. 15A and 15B are schematic illustrations of further examples of a multi-sensor according to the alternative embodiment of the invention.

The drawings are only schematic and are non-limiting. In the drawings, the size of some of the elements may be exaggerated and not drawn on scale for illustrative purposes.

Any reference signs referring to the drawings and mentioned in the claims shall not be construed as limiting the scope.

In the different drawings, the same reference signs refer to the same or analogous elements.

DETAILED DESCRIPTION OF ILLUSTRATIVE EMBODIMENTS

Various embodiments of sensors according to embodiments of the present invention, including piezoelectric thin film transducer(s) and transducer array(s), allow for cost effective, efficient and miniature ultrasound transducers/arrays. An ultrasound transducer according to embodiments of the present invention is a flat, low profile ultrasound transducer. Other embodiments of the present invention include a flat, low profile thin film transducer array, which enables scanning and electronic steering of the ultrasound beam. Such compact and low profile ultrasound transducers or arrays may find various applications, particularly since they do not need a line of sight and are insensitive to smoke and heat in contrast to infrared sensors. Besides presence detection for e.g. in buildings for lighting control, for air conditioning control, for safety and security, for activity sensing, the transducer arrays can also be used for proximity detection covering e.g. positioning in e.g. mobile phones or for navigation of e.g. robotics or for distance measurements in numerous applications such as parking aid, collision avoidance . . . or for gesture control in user interfaces, or flow sensing or $CO_2$ sensing or tracking based on ultrasound or for ultrasound imaging including medical imaging.

Figure 1:
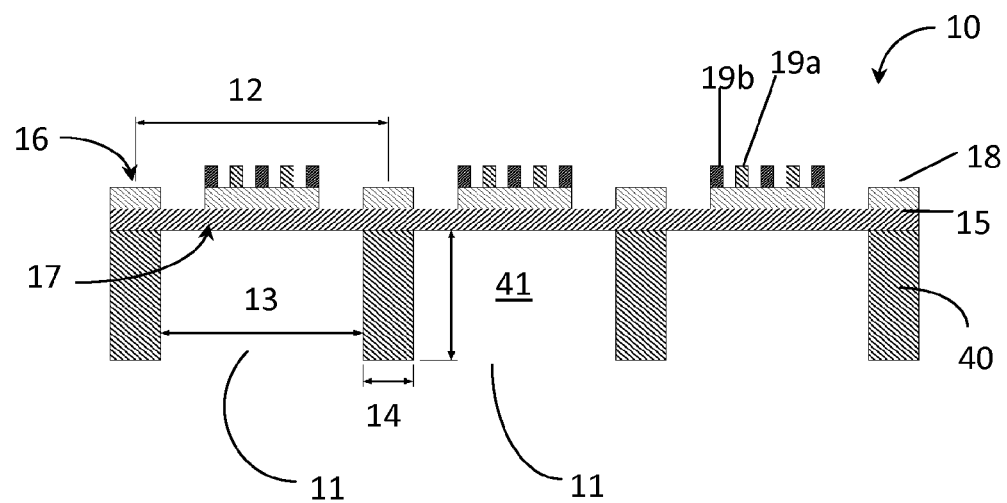
FIG. 1 illustrates an ultrasound transducer array according to an embodiment of the present invention. As an option on top of the membrane on the side of the electrode layer 19 a protection layer of an inorganic material such as silicon nitride, or silicon oxide or combinations of silicon oxide and silicon nitride or a organic protection layer or a combination of an organic and an inorganic protection layer can be applied.

In an illustrative embodiment, thin film piezoelectric transducer arrays as given in FIG. 1 shows a cross-section of an array 10 of thin film piezoelectric transducer elements 11 according to embodiments of the present invention. The array 10 and/or each transducer element 11 may have any size and shape. The pitch 12 of the transducer elements 11 may be selected based on application. For operation in air to achieve a low attenuation in air, the arrays 10 are designed typically to operate at frequencies of 30-450 KHz. To operate at these low frequencies, the element pitches 12 are approximately a few hundred micrometers to several thousand micrometers. The pitch 12 is the width 13 of a transducer element 11 plus the width 14 of the gap that separates one element 11 from an adjacent element 11. For operation of the devices at frequencies of 500 KHz up to 30 MHz and higher each transducer element 11 has a much smaller width of some hundred micrometer up to some tens of micrometer or up to some micrometer dependent on the operating frequency.

According to the Rayleigh criterion, the spatial resolution L of the transducer array is determined by the operating frequency f of the device, the sound velocity c, the aperture a of the device, and the distance R the object is away.

$$\frac{L}{R} = \gamma \frac{\lambda}{a/2}$$

where γ is a constant of order 1 (1.22 for a circular aperture) and λ=c/f. For a rectangular aperture with orthogonal apertures $a_x$ and $a_y$, the resolutions $L_x$ and $L_y$ obey the same relation with γ=1.43.

Figure 2A:
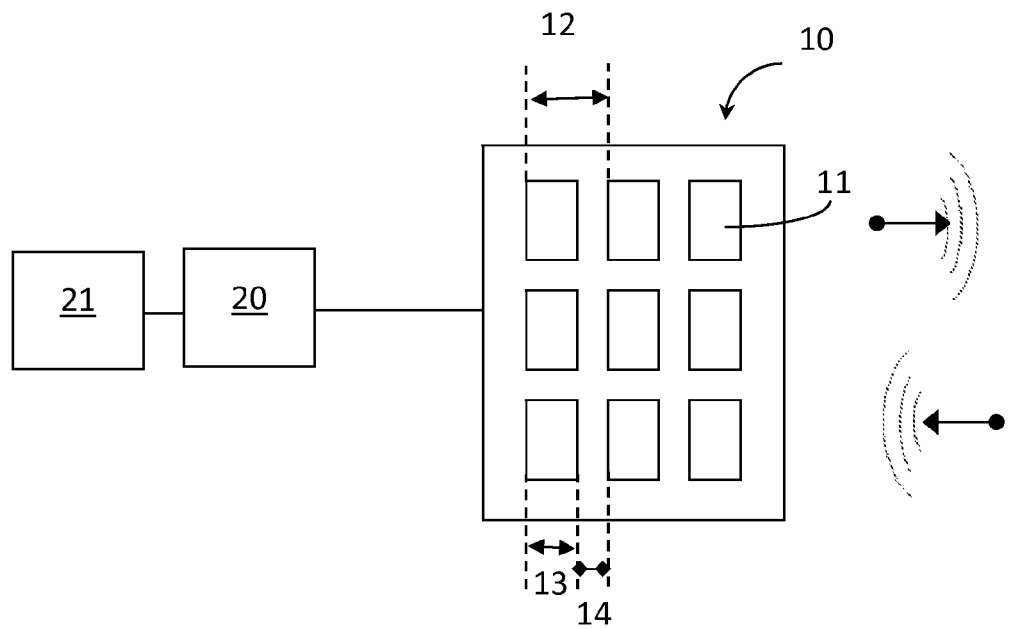
FIGS. 2a and 2b represent block-schematic diagrams of an ultrasound transducer array according to embodiments of the present invention coupled to a processor and a memory.
Figure 2B:
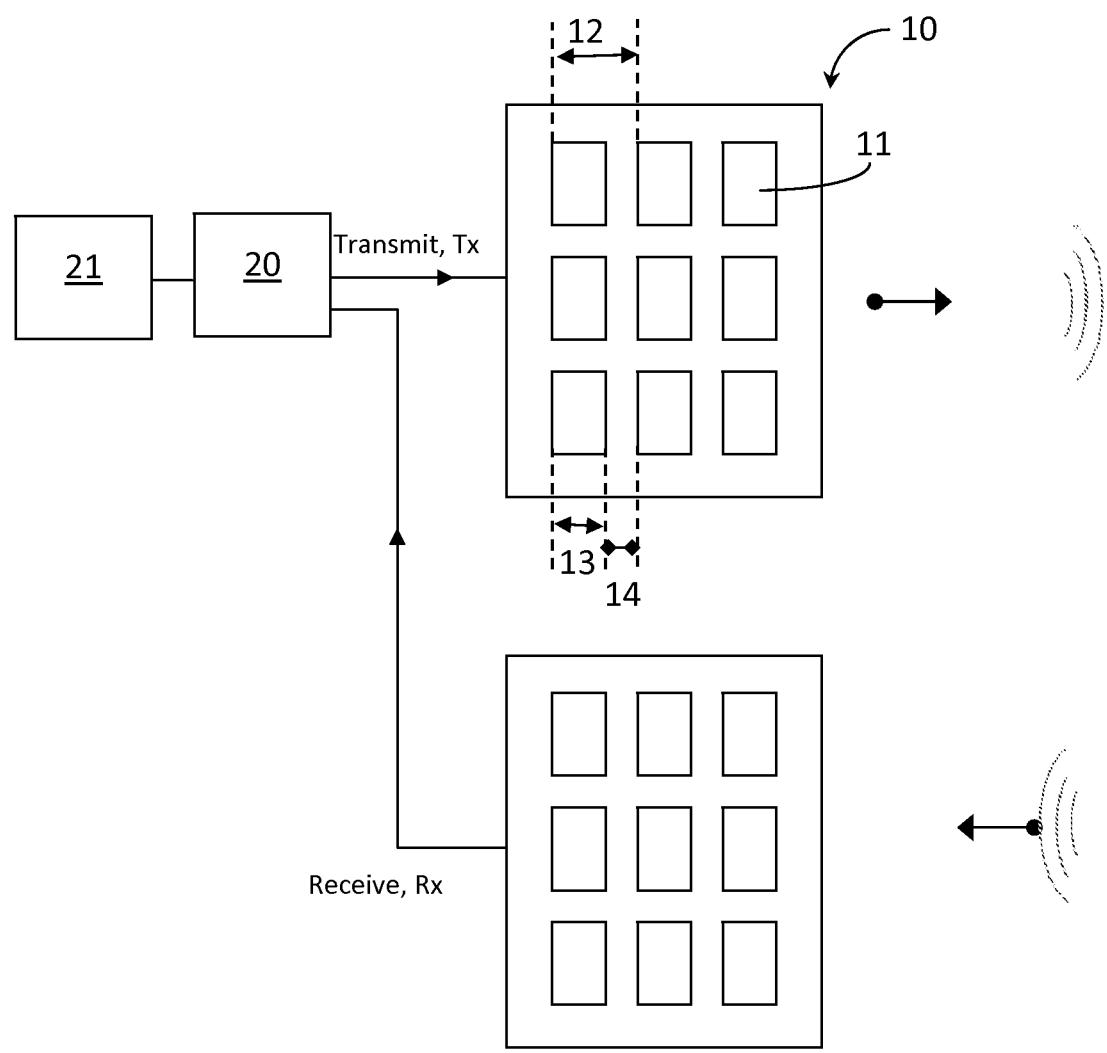

FIG. 2*a* shows a schematic for a pulsed operation of the ultrasound transducer array with top view of an array 10 of thin film piezoelectric transducers 11 according to embodiments of the present invention. Here the same ultrasound array can transmit and receive making use of some switching circuitry as shown in the figure. The array 10 may be connected to a controller or processor 20 with associated electronics, such as phase shifters, delay taps, converters and the like, as described in U.S. Pat. No. 6,549,487 to Gualtieri, for control of the array 10 and processing information received from the array 10. A memory 21 may also be operatively coupled to the processor 20 for storing various data and application programs and software instructions or codes for control and operation of the array system 11 when executed by the processor 20. The array 10 can be actuated to make the ultrasound beam to scan in a linear fashion or a 2D scan. When long transmit time is requested, it may require two arrays: one for transmit and the other for receive as shown in FIG. 2b. Instead of two separate arrays, two rows from the same array 10 can also be used as a transmitter and receiver.

A transducer according to embodiments of the present invention has a high output pressure, optionally a higher output pressure than prior art sensors.

In one aspect, the present invention provides a transducer 11, more particularly an ultrasound transducer, comprising a membrane 15 configured to deform in response to a force, the membrane 15 having a first major surface 16 and a second major surface 17. The membrane 15 is partially freed from a surface after formation of the sensor to allow movement of the membrane. The transducer 11 furthermore comprises a piezoelectric layer 18 formed over the first major surface 16 of the membrane 15, the piezoelectric layer 18 having an active portion. The piezoelectric layer 18 may be patterned if so desired to increase performance. Further, a pair of first and second electrodes 19a, 19b is formed, in contact with the piezoelectric layer 18, wherein an electric field between the first and second electrodes 19a, 19b is proportional to the displacement of the piezoelectric layer 18.

In accordance with embodiments of the present invention, support structures 40 are provided at the second major surface 17 of the membrane 15 on adjacent sides of the active portion of the piezoelectric layer 18, the support structures 40 having walls substantially perpendicular to the second major surface 17 of the membrane 15, so as to from a trench 41 underlying the active portion of the piezoelectric layer 18.

A transducer 11 according to the first aspect of the present invention shows a higher output pressure on the membrane 15 at the side connected to the support structures 40, due to the trench 41.

The output pressure dependents on the dimensions of the trench 41 and other parameters and will be described in more detail in the following sections.

In the embodiment illustrated in FIG. 1, the first and second electrodes 19a, 19b are provided on a same side of the piezoelectric layer 18. In alternative embodiments (not illustrated), and depending on the type of piezoelectric material used, the first and second electrodes 19a, 19b may be provided on opposing sides of the piezoelectric layer 18. As an option on top of the membrane on the side of the electrode layer 19 a protection layer of an inorganic material such as silicon nitride, or silicon oxide or combinations of silicon oxide and silicon nitride or an organic protection layer or a combination of an organic and an inorganic protection layer can be applied to prevent the sensor from mechanical damage.

Figure 3A:
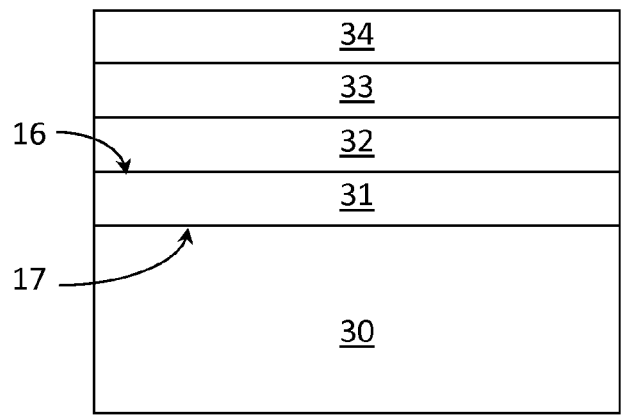
FIGS. 3a, 3b and 3c illustrate a method of processing an ultrasound transducer according to embodiments of the present invention.

To realize a transducer 11 according to embodiments of the present invention with high output pressure along a low cost process, in a first step (FIG. 3(a)) a standard semiconductor wafer, e.g. a Si wafer such as a Si monitor wafer, and not necessarily a semiconductor on insulator (SOI) may be used as a substrate 30. In embodiments of the present invention, the term "substrate" may include any underlying material or materials that may be used, or upon which an ultrasound transducer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. Furthermore, "substrate" may include also a non-semiconductor substrates like for instance a glass, or ceramic substrate. The term "substrate" is thus used to define generally the elements for layers that underlie a layer or portions of interest.

On the substrate 30, a thin film membrane 31 is processed. The membrane 31 has a first major surface 16 away from the substrate 30 and a second major surface 17 facing the substrate 30. The thin film membrane 31 may be made from any suitable material. In particular embodiments, the thin film membrane 31 may be an insulating layer. In particular embodiments, the thin film membrane 31 may in itself be a multi-layer, of which for example all layers or at least the outer layers (closest to and furthest away from the substrate 30) are insulating layers. The thickness of the thin film membrane 31 may be such that, after being at least partially freed from the substrate 30, the membrane 31 is able to oscillate if suitably driven. The thin film membrane 31 may for example be composed of a first layer of silicon nitride with pre-determined thickness, e.g. between 0.3 μm and 2 μm, e.g. processed by LPCVD or PECVD, with on top thereof a thin silicon oxide layer, which can for example have a thickness in the order of several hundred micrometer up to several micrometer. The stack can also be a multilayer stack with a thin layer of silicon oxide with thickness of hundred nanometer up to several hundred nanometers underneath the silicon nitride. On top of this silicon oxide layer the silicon nitride and silicon oxide layers are deposited. Using for example LPCVD processes silicon nitride films with thicknesses of 0.5-2.5 um are deposited in an optimized process with stress levels of typically 40-80 MPa tensile. The silicon oxide can be deposited based on TEOS LPCVD or PECVD with thickness of 0.5-1.5 um. Typical stress values of −20 to −60 MPa compressive can be applied.

The membrane stack on the substrates can also be a stack of silicon oxide, silicon and silicon oxide.

In thin-film manufacturing, thin-films often possess residual stress due to the deposition temperature or the deposition technique. For the proposed invention control of the stress of the layers is very important. More precisely the total stress of all layers has to be controlled. The total stress or better the total force $F^{lat}$ acting on the anchors in lateral direction is calculated with $$\sum_{i=1}^{N} b^{[i]} t^{[i]} \sigma_1^{res[i]}$$

The membrane consists of several layers. These layers are numbered starting with [1] for the layer that is nearest to the substrate (30) to [N] for N layers in the layer stack. In the formula the superscript [i] denotes the i-th layer of the membrane layer stack. The length and the thickness of the membrane are given with $b^{[i]}$ and $t^{[i]}$, respectively. Note that the width is the lateral dimension of the membrane that is perpendicular to the cross section plane shown in FIG. 1. $\sigma^{res[i]}_1$ is the residual stress of the i-th layer. Tensile stress is represented by a positive number and compressive stress by a negative number.

It can be noticed that the effect of a patterned layer on the lateral force is decreased linearly with the area the layer occupies on the membrane.

The effect of the lateral force is that it changes the effective bending stiffness of the membrane ($EI_{eff}$). For a total tensile stress in the membrane, the effective bending stiffness increases and vice versa. This could be compensated by a larger or smaller membrane size, respectively. The bending stiffness is used in membrane theory to describe the mechanical stiffness of the membrane against bending. The effective bending stiffness EIeff is calculate using $$\overline{EI}_{eff} = \overline{EI}(1+\alpha)$$

With alpha being the dimensionless lateral force given by $$\alpha = \frac{L^2 F_{lat}}{4\pi^2 \overline{EI}}$$

L denotes the width of the elements (11) in FIG. 1. $F_{lat}$ is the force in lateral direction as given in the equation above. EI is the bending stiffness of the membrane layer stack without any lateral forces. Hence the effect of the residual stress is that it influences the effective membrane stiffness.

The membrane stiffness of a layer stack is given by $$\overline{EI} = \sum_{i=1}^{N} E^{[i]} \left( \frac{b^{[i]} t^{[i]3}}{12} + b^{[i]} t^{[i]} (z^{[i]} - z^{neut})^2 \right)$$

The superscripts denote the number of the layer in the layer stack. $b^{[i]}$ and $t^{[i]}$ are the length and the thickness of the i-th layer, respectively. $E^{[i]}$ represents the Young's modulus of the i-th layer. $z^{[i]}$ is the distance in the thickness direction between the bottom of the membrane and the center of the i-th layer. $z^{neut}$ is the position in the thickness direction of the neutral plane of the membrane. This position is determined by $$z^{neut} = \frac{\sum_{i=1}^{N} z^{[i]} E^{[i]} t^{[i]} b^{[i]}}{\sum_{i=1}^{N} E^{[i]} t^{[i]} b^{[i]}}.$$

The symbols are the same as in the previous equations.

Using for example LPCVD processes for the silicon nitride and silicon oxide or silicon oxide, silicon nitride, silicon oxide the layer stack is also deposited on the substrate 30 on the opposite surface to the surface 17. This layer stack can be lithographically patterned and can be used as hard mask for etching trench 41 into e.g. the silicon substrate. This lithographic step can be done directly after the membrane deposition or after any other processing step in this process, dependent what is most convenient for the production flow.

On the first major surface 16 of the membrane 31 a barrier layer 32 may be deposited. In a particular embodiment, a thin, e.g. 60 nm to 100 nm thick titanium oxide layer may be deposited. But also any other barrier layer such as Al2O3, ZrO2, HfO2, MgO or combinations of these oxides with piezoelectric lead titanate zirconate layers can be applied.

In some embodiments of the present invention, on top of the barrier layer 32, a piezoelectric layer 33 may be provided, with on top thereof an electrode layer 34. In alternative embodiments (not illustrated), on top of the barrier layer 32 a first electrode layer is provided, then a piezoelectric layer 33 and then a second electrode layer.

The piezoelectric layer 33 may be based on different materials, such as:
  lead titanate zirconate,
  PbZrxTi1-xO3 (0<x<1) with and without doping, the doping may comprise La, Mn, Fe, Sb, Sr, Ni or combinations of these dopings,
  other piezoelectric layers such as Pb(Zn1/3Nb2/3)O3-PbTiO3, Pb(Mg1/3Nb2/3)O3-PbTiO3, Pb(Ni1/3Nb2/3)O3-PbTiO3, Pb(Sc1/3Nb2/3)O3-PbTiO3, Pb(Zn1/3Nb2/3)1-x-y(Mn1/2Nb1/2)xTiyO3 (0<x<1, 0<y<1), Pb(In1/2Nb1/2)O3-PbTiO3, Sr3TaGa3Si2O14, K(Sr1-xBax)2Nb5O15 (0<x<1), Na(Sr1-xBax)2Nb5O15 (0<x<1), BaTiO3, (K1-xNax)NbO3 (0<x<1), (Bi,Na,K,Pb,Ba)TiO3, (Bi,Na)TiO3, Bi7Ti4NbO21, (K1-xNax)NbO3-(Bi,Na,K,Pb,Ba)TiO3 (0<x<1), a(BixNa1-x)TiO3-b(KNbO3-c)1/2(Bi2O3-Sc2O3) (0<x<1, a+b+c=1), (BaaSrbCac)TixZr1-xO3 (0<x<1, a+b+c=1), (BaaSrbLac)Bi4Ti4O15 (a+b+c=1), Bi4Ti3O12, LiNbO3, La3Ga5.5Nb0.5O14, La3Ga5SiO14, La3Ga5.5Ta0.5O14,
  aluminium nitride, or organic polymers such polyvinylidendifluoride or any other piezoelectric thin film material can be applied.

The piezoelectric layer may have a thickness between several hundred nanometers up to several micrometers. A lanthanum doped lead titanate zirconate film can for example have a thickness of 0.5-2 um with a typical tensile stress of 20 MPa to 400 MPa, dependent on the thickness and processing. But of course thinner or thicker layers also with different residual stress can be applied.

The electrode layer 34 may be made of any suitable conductive material. In particular embodiments it may be an electrode stack of e.g. Ti+Au. Such electrode stack may be deposited with a thickness of titanium of 50 nm and Au of several hundred nanometer up to one micrometer. Typical stress values of such a layer are in the order of 100-300 MPa tensile. Besides a Ti/Au stack, the electrode layer 34 may consist of any suitable material, for example any other metal layer such as e.g. Pt or a suitable conductive material stack such as e.g. TiW/Al, undoped or doped with Cu, or Si, TiN+Al undoped or doped with Cu or Si can be applied. Of course any other metal might also be possible.

Figure 3B:
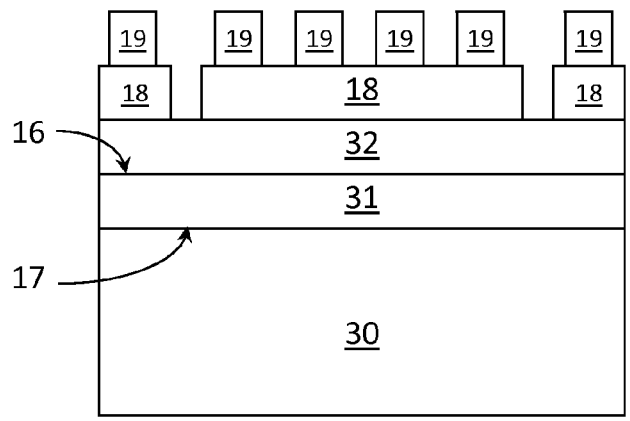

In a next step, illustrated in FIG. 3b the electrode layer(s) 34 as well as the piezoelectric layer 33 are patterned, e.g. lithographically patterned, thus forming the patterned piezoelectric film 18 and the patterned electrodes 19, so as to realize the active area of a piezoelectric thin film ultrasound element. Although a plurality of electrodes are shown in FIG. 3b, the invention in its simplest form can work with two electrodes. In an extension of the designs also a layout with metal regions 19 located at the edges of each element on top of the piezoelectric layer 18 is removed. Alternatively also the piezoelectric layers might not need to be patterned. In this way a mask step can be reduced in the process, which will bring the cost of the products down.

In an option after this step or after any other substrate patterning step, a protection layer not shown can be applied on top of the membrane on the side of the electrode layer 19. The protection layer can be an inorganic material such as silicon nitride, or silicon oxide or combinations of silicon oxide and silicon nitride or an organic protection layer or a combination of an organic and an inorganic protection layer can be applied to prevent the sensor from mechanical damage. This protection layer can also be lithographically patterned.

Figure 3C:
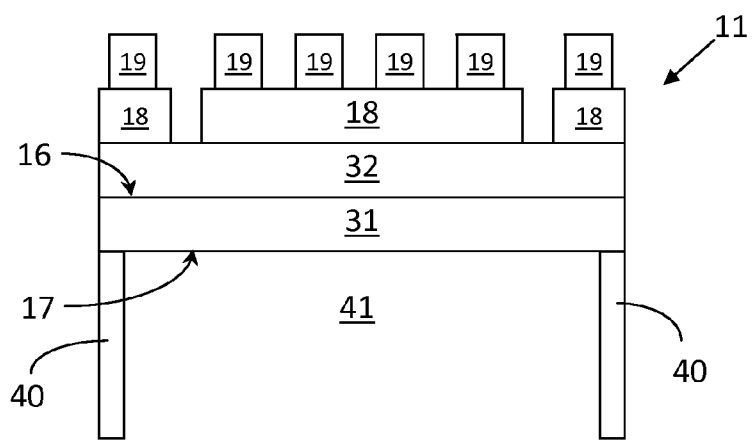

To realize the free standing membrane 18 and achieve a high element density, the substrate material, e.g. silicon, is now removed from below the active area of the piezoelectric thin film ultrasound element. This is illustrated in FIG. 3c. This is achieved by patterning from the backside of the silicon 30 the layer 31', not shown in FIG. 3c, which can be the membrane layer deposited on the back side of the wafer during membrane processing. But the layer 31' can also be any other layer inorganic or organic layer deposited for patterning the Si from the backside. In particular embodiments of the present invention, such removal of substrate material may be performed by dry etching substrate 30 from the back side down to membrane 31. Alternatively a major dry etching combined with a wet-etch in KOH may be applied. For the etching steps dry as well as wet etching, protection layers such as organic layers or inorganic layers or combinations of inorganic and organic layers can be applied on the top of the wafer but can also be applied at the side walls of the trenches.

The removal of the substrate material is such that support structures 40 remain on adjacent sides of the active portion of the piezoelectric layer 18. The support structures 40 form a trench 41 underlying the active portion of the piezoelectric thin film ultrasound element. In particular embodiments of the present invention, the removal of the substrate material so as to form the trench 41 is such that the support structures 40 have walls bordering the trench 41 which are substantially perpendicular to the second major surface of the membrane 31. In this way, by removal of substrate material such that the remaining support structures have walls which are substantially perpendicular to the second major surface of the membrane 31, transducer elements 11 can be placed very close to each other in an array 10. As an example, transducer elements 11 with several hundred micrometers up to several millimeters width are separated from each other by only several hundred micrometers. Hence, the full dry etching or at least partial dry etching as used in embodiments of the present invention enables a much higher element density as compared to a full wet etching of the substrate.

In a further extension of the process, in order to realize low cost devices, before dry etching the substrates, e.g. standard monitor wafers, may be thinned, for example down to 50-500 μm. Thereafter the substrate, e.g. Si, is bulk micro-machined with full dry etching or at least partially dry etching.

Finally to achieve very high element densities and use a low cost process also substrates with predetermined crystal orientations may be used, e.g. Si (110) wafers can be used, on top of which the membranes 31 and piezoelectric layers 33 are deposited. In particular, Si (110) etching with KOH results in steep walls and in this way a high element density is obtained.

For other substrates, the material could also be removed underneath the membrane with for example sandblasting or any other technology.

An advantageous feature of an ultrasound transducer array 10 in accordance with embodiments of the present invention or a transducer element 11 in accordance with embodiments of the present invention is that the devices 11 show an higher output pressure on the membranes 31 at the second major surface 17 where they are connected to the support elements 40 compared to the opposite side (first major surface 16).

Figure 3D:
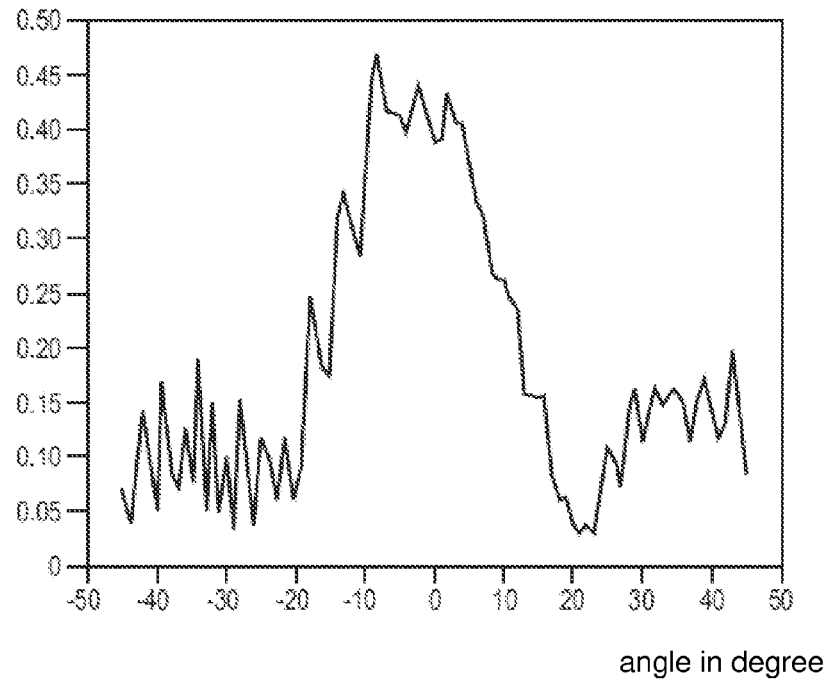
FIG. 3d is a graph illustrating the normalised output pressure (normalized to the maximum output pressure) of an ultrasound transducer array measured as a function of the angle on the support side 40 of the ultrasound transducer array.
Figure 3E:
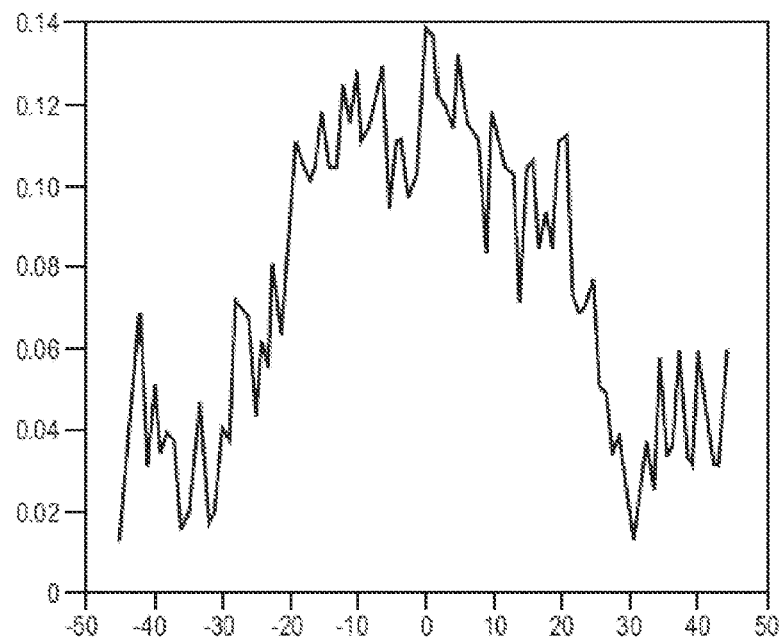
FIG. 3e is a graph illustrating the normalised output pressure (normalised to the maximum output pressure that is measured at the support side 40 shown in FIG. 3d) of an ultrasound transducer array measured as a function of the angle on the side opposite to the support side 40.

An example of typical data achieved with such type of devices is given in the following. But of course it is clear that the measured data are strongly dependent on the device design and membrane stress and can thus be strongly modified. For example a piezoelectric thin film array according to FIGS. 1 and 3a comprises typically 8 elements with a typical membrane 31 with a stack of silicon oxide 0.5 um and silicon nitride 2 um and silicon oxide 1 um. On membrane 31 a titanium oxide barrier layer 32 of 60 nm and a piezoelectric layer 18 of typically 1.6 um and a titanium layer of 50 nm and a Au layer of 1 um is deposited, where the titanium and gold layers form the metal electrodes 19 and have a width of typically 10 um. The width of the piezoelectric thin film 18 between the metal electrodes 19 is typically 6 um and typically the metal electrodes 19 form per transducer element 11, 16 signal lines and 17 ground contacts on top of the piezoelectric thin film 18. The width where no piezoelectric film 18 is present in element 11 is on both sides of the piezoelectric film 18 typically 110 um. For such an array with a trench 41 width of 802 um and a length of the membranes of 3 mm and a Si support structure 40 of 400 um width and a height of the Si support of the order of 680 um, which is typically operating at 70-80 KHz, the ultrasound output pressure of the piezoelectric thin film array transmitted on the array side where the Si support structure 40 is located is measured with a microphone. The output pressure, which is normalized to the output pressure at the support side 40 of an ultrasound transducer array, is a factor of 4 higher compared to the output pressure measured on the opposite side (see FIGS. 3d and 3e).

Beside the dimensions of the ultrasound transducer arrays given above, also any other size and shape of the elements can be applied.

For example membranes, piezoelectric thin films and electrodes similar to the example above can be used, which show however only a length of 2 mm instead of 3 mm, which results in ultrasound transducer arrays operating at frequencies of typically 60-90 KHz and showing at the support side 40 also higher output pressures than on the opposite.

Figure 4:
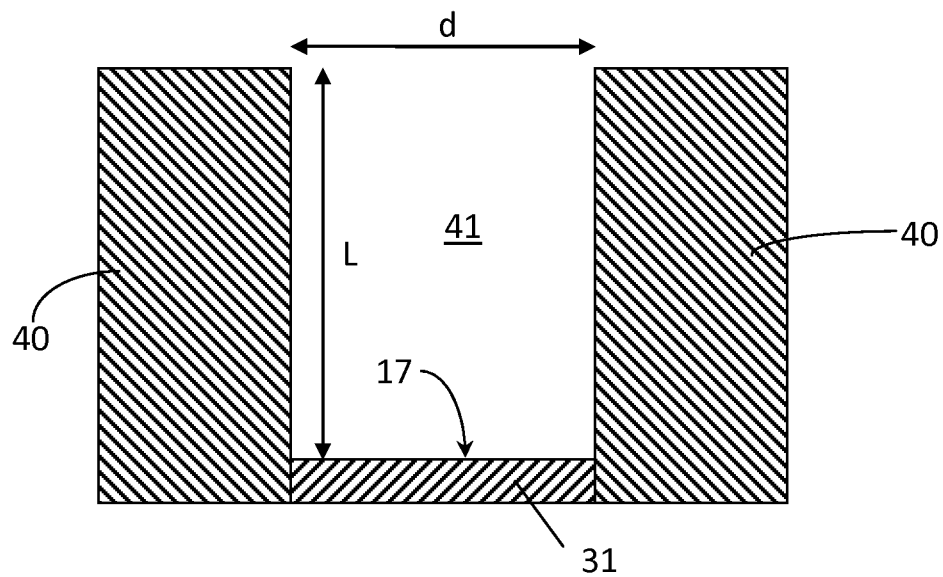
FIG. 4 is a cross-section through one transducer element according to embodiments of the present invention, showing the geometry of dimensions which may be used in accordance with embodiments of the present invention.

The extremely higher output pressure of a factor of 4 measured on the Si support side 40 of the ultrasound transducer arrays can be explained as follows. The support structures 40 at the borders of each element 11 form a trench 41 which functions in a way similar to a half-open pipe, which has the effect of enhancing the pressure output for a specific range of wavelengths. In a particular experiment, the enhancement factor was in the order of 4, but also smaller and larger enhancements are certainly possible as shown in the simulations reported below. Therefore, the device 11 is preferably made such that the pressure waves at the substrate side of the elements 11 are used for the application concerned (rather than pressure waves generated at the other side of the membrane 31). From the simulation results, it can be seen that the pressure enhancement factor (the ratio of the pressure at the substrate side to the pressure at the opposite side of the element) has a peak at a predetermined frequency. This is explained by the creation of standing waves in the pipe or trench 41 formed by the support structures 40. See FIG. 4 for the geometry.

At the open side of the trench 41, the waves generated by the oscillating membrane 31 are partially reflected with a phase jump of π. If the length L of the trench 41, i.e., the dimension substantially perpendicular to the second major surface 17 of the trench 41, matches the resonance condition for standing waves, the output pressure can be largely amplified. The resonance condition is given by $$f_n = \frac{v}{4L'}(2n-1)$$

Where, $f_n$ is the n-the resonance (n=1, 2, 3, 4, ... ), v the speed of sound, and L' the effective acoustic length of the trench. The effective acoustic length L' of the trench is defined as $$L' = L + \alpha d$$

where, L is the geometrical length (see FIG. 4) of the trench, i.e., the thickness of the substrate 30 before etching of the trench 41, d the characteristic dimension of the cross section of the trench 41, and α a correction factor, which depends on the geometry of the cross section of the trench. Examples of the correction factor α and the characteristic dimension d are given in the table below for different cross section geometries:

| cross section geometry of the trench | Characteristic dimension d | Correction factor α |
|---|---|---|
| Trench 41 with a circular cross-section in a direction substantially parallel to the second major surface of the membrane 31 | Diameter of the trench | 0.35 |
| Trench 41 with a trench-like cross-section in a direction substantially parallel to the second major surface of the membrane 31 | Width of the trench | 0.6 |

The resonance frequency may shift if the resonance described here interferes with a resonance of the membrane.

Figure 5:
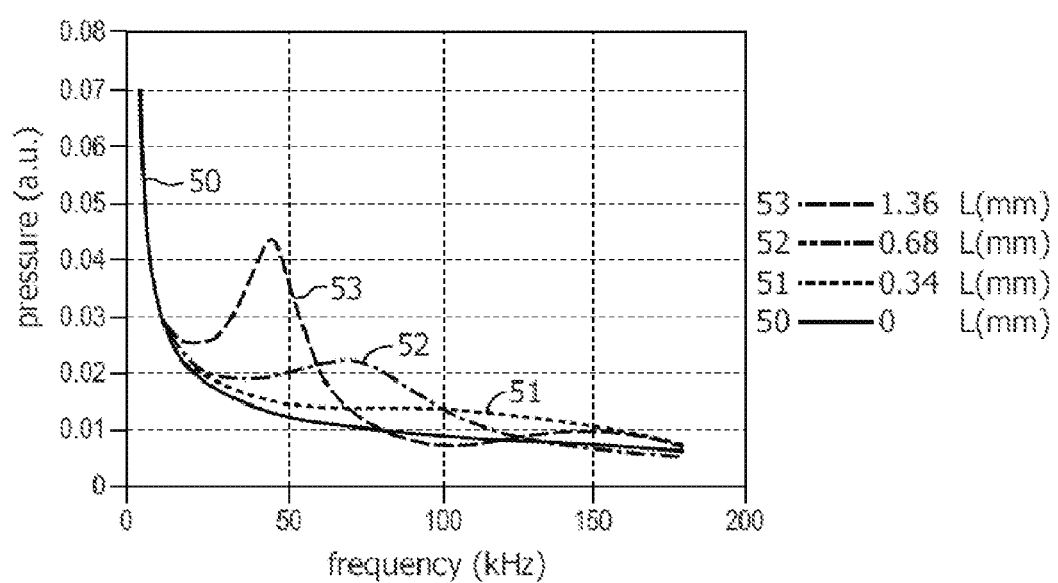
FIG. 5 is a graph illustrating simulation of the output pressure as a function of frequency for several values of the height of the substrate support of a transducer element (the depth of the trench below the substrate). In these simulations, which specifically explain the acoustical effect of the substrate supports, the element is simply modelled as a piston between supports in an infinite solid baffle. The simulated element is infinite in the dimension perpendicular to the cross-section illustrated in FIG. 4.

FIG. 5 illustrates a simulation of pressure at the output of the trench 41 as a function of oscillation frequency of the membrane 31, for several values of the height of the support structures 40, hence for several values of the length L of the trench 41 (depth of the trench)

In these simulations, the membrane movement of the transducer element 11 is modeled as a piston between supports in an infinite solid baffle. The simulated element is 0.8 mm wide and it is infinite in the dimension perpendicular to the cross-section of FIG. 4. These simulations specifically explain the acoustical effect of the support structures 40. It can be seen that for each oscillation frequency, in particular between 20 kHz and 150 kHz, trenches with a depth different from zero provide a higher output pressure than in case no such trench would be present (50).

Figure 6:
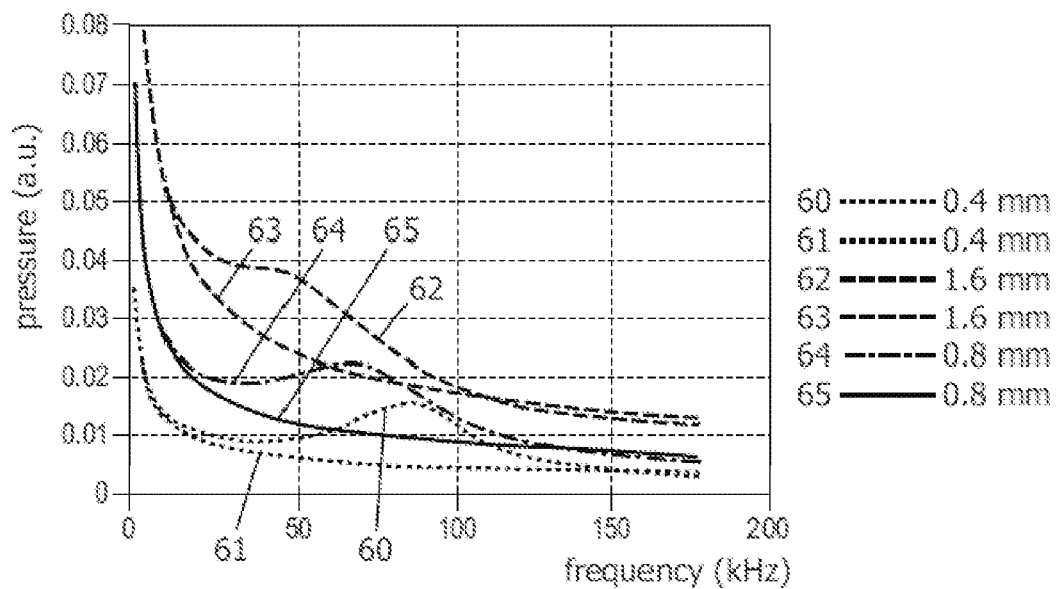
FIG. 6 is a graph illustrating simulation of the output pressure as a function of frequency for several values of the width of a transducer element. The simulation model details are as in FIG. 5.

Usually, the width of piezoelectric elements 11 equals the characteristic dimension d of the opening 41. In case of the Helmholtz resonator (see below) the characteristic length might also be smaller. The resonance frequencies $f_n$ (of the half-pipe) depend also on the element width via the effective length L' of the trench 41. This is demonstrated by FEM simulations. In FIG. 6 the acoustical output pressure is shown as a function of frequency for several values of the width of the element. Here the width of the elements is varied whereas the length of the trench i.e., the thickness of the Si substrate is kept constant at 0 and 0.68 mm. For each value of the width, the lower curves (61, 63, 65) show the result with a rigid support of length 0 and the upper ones (60, 62, 64) show the effect of a support of length 0.68 mm. Other simulation model details are as in FIG. 5. It can be seen from FIG. 6 that the larger the width of the trench 41, the lower is the resonance frequency of the half-pipe.

The acoustic impedance of a pipe is the ratio of the acoustic pressure in the pipe to the flow velocity through the pipe. The acoustic impedance of a pipe depends on the characteristic dimension of the cross section d of the pipe and the length of the pipe L.

The reflection of the acoustic pressure wave at the open end of the pipe is given by $(Z_2-Z_1)/(Z_2+Z_1)$ where $Z_2$ is the acoustic impedance of the pipe and $Z_1$ is the acoustic impedance in free space. Hence, a pipe with a lower d value leads to larger reflections at the open end. In return the relative pressure enhancement peaks increase and become narrower. This can be used to tune the width of the resonance and the amplification factor. It is to be noted that if the opening dimensions are changed, in particular the characteristic dimension d, the length L of the pipe has to be adjusted too to account for the change of effective length L'.

Figure 7:
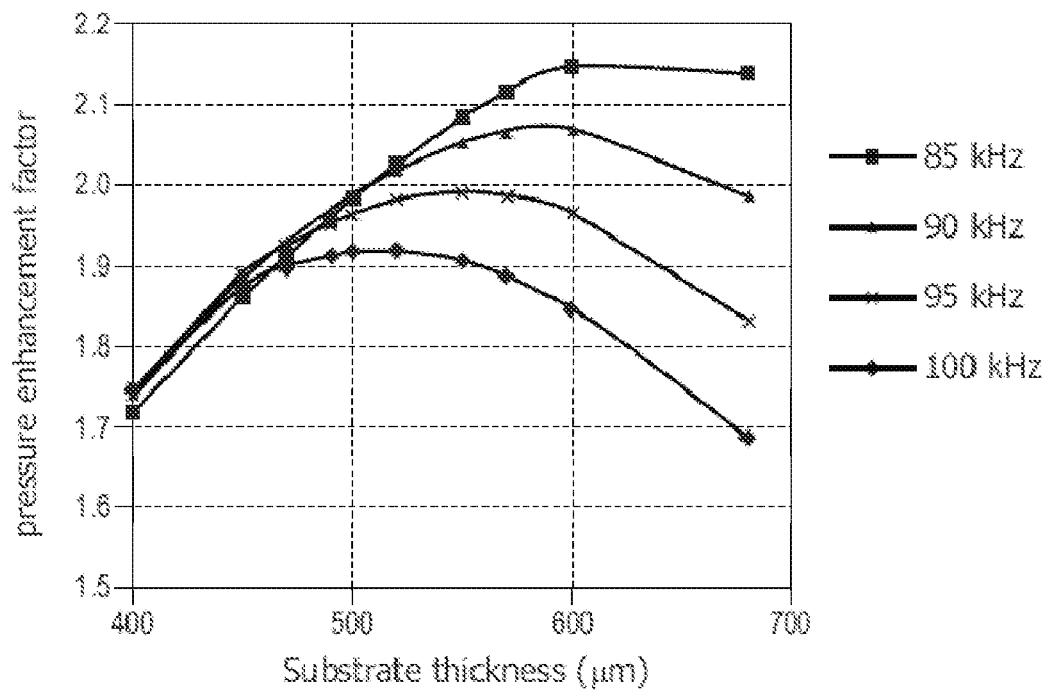
FIG. 7 is a graph illustrating the output pressure enhancement factor (the ratio of the output pressures at the support side of the membrane over the output pressure at the other side) as a function of the substrate, e.g. silicon, support height (trench depth) at various frequencies for a transducer element according to embodiments of the present invention of 0.8 mm width. The simulation model details as in FIG. 5.

FIG. 7 illustrates the pressure enhancement factor as a function of the support structure 40 height (trench length L) at various frequencies. The characteristic dimension of the cross section of the trench is kept constant at d=0.8 mm. Simulation model details are as in FIG. 5. It can be seen that, for each oscillation frequency, an optimal length of the trench 41 can be found, at which optimal length the pressure enhancement factor is maximal. The higher the oscillation frequency, the lower the corresponding optimal length. This results from the fact that the highest enhancement factor is at, or at least near to the resonance frequency, which drops with the length (support height).

The above simulations have been performed with supports 40 based on Si from the Si wafers. But the support 40 can also be made out of other inorganic materials such as glass, metal, ceramic or can also be made out of organic materials. The supports can also be made out of combinations of materials where 40 is build up from e.g. a Si part e.g. 50-500 um in height. To achieve the optimum thickness of the support a polymer or glass or metal or ceramic part is mounted by e.g. by gluing on top. A drawing for such type of supports included in a packaged device is shown in the FIG. 8a. As can be shown the Si is polished down to e.g. 40-400 um. A polymer package from e.g. FR4 is applied by e.g. gluing comprising also the support 40. The Si side is covered for protection with a thin mesh based e.g. of metal. In the package alternatively an absorbing layer can be applied.

Alternatively the support can be fully processed out of Si. One example of a possible package is shown in FIG. 8b. Also in this package alternatively an absorbing layer can be applied.

To prevent cross talk between the elements also in the package separation parts in the package can be included see FIG. 8b, which can be made out of inorganic or organic material or combinations of both.

Alternatively also the supports could be made out of Si with on top ceramic or glass, which e.g. can be included also in the package as shown in FIG. 8c. Here instead of a plastic package a ceramic or glass package can be applied. The package on the membrane side could be of course also based on plastic. In the package alternatively an absorbing layer can be applied.

Alternatively the trenches 40 are fully processed out of a polymer layer and included in the package as schematically shown in FIG. 8d.

In a further embodiment of the present invention for all ultrasound transducer array with high output pressure, the packaging includes on the support side 40 a mesh to protect the transducer from mechanical damage. A mesh for protection can for example be metal mesh or metal grid with large openings of approx. 200 micrometer*200 um and metal wire diameter of 28 micrometer. Also less open meshes with opening of 500 micrometer*500 micrometer and metal wire diameter of 250 micrometer can be used.

In a further embodiment of the present invention a simple, low cost packaging of the ultrasound transducer arrays is realized by mounting the array with the transducer elements with the supports 40 and the openings 41 by e.g. gluing on a printed circuit board. The printed circuit board comprises a hole at the position where the transducer elements on the die are located. For protection of the array from mechanical damage a metal mesh is glued on the printed circuit board over all the elements on the support side 40. On the opposite of the transducer array where the electrodes 19 are located, an inorganic or organic rigid body is glued on the printed circuit that protects the transducer elements on the electrode side 19. The rigid body is a plastic or ceramic or glass or metal cover that has inside a hole so that it does not touch the ultrasound transducer elements on the electrode side 19. The rigid body may comprise inside an ultrasound absorbing material.

The above simulations have been performed for piston-like movement of the transducer elements, more particularly of the membranes thereof. In fact, the elements are piezoelectric and have a specific limited frequency band of preferred operation. One of the parameters that determine this frequency band is the element width d. Not in all cases it will be preferable to choose the height of the support structures 40 such that the frequency peak due to the support structures is in the frequency band of operation. The height of the peak is strongly dependent on frequency, so that, within the frequency band of operation, the enhancement factor for a support structure height that gives a peak outside the band of operation may be as large as the enhancement factor for a support height that gives a peak within the band of operation (compare curves 51 and 52 in FIG. 5 around 100 kHz).

In another embodiment of the present invention, an even higher output pressure can be achieved if the support structures 80 are structured. A sketch of an example of such structuring is given in FIG. 9a. Part of the structuring may be executed not in the semiconductor substrate 30, e.g. silicon substrate, but in a packaging layer. In the particular embodiment illustrated in FIG. 9a, the part of the structured support structures 80 with height $h_2$ could for example be implemented in the substrate, while the part of the structured support structures 80 with height $h_1$ could be implemented in a packaging layer. But it could also be that both parts height h2 and h1 are realized in the packaging part or in the silicon part.

In FIG. 9b an example is shown where h2 is made out of Si and h1 is made out of a polymer. In the package alternatively an absorbing layer can be applied. Please note that this is only an example and many other versions of packages should be possible.

In the particular example of the FIG. 9a, the oscillating element, e.g. membrane 31, is at the bottom of a Helmholtz resonator kind of geometry.

In FIG. 10 it is shown that such a structure may lead to enhancements that are far superior to the enhancements by unstructured supports 40. FIG. 10 illustrates the pressure for the structured trench 81 as illustrated in FIG. 9a, with width w=0.8 mm. Curve 90 is the curve for an oscillating element without trench. For the other curves, the heights of the trench 81 are $h_1$=2.67 mm and $h_2$=1.33 mm. The values of w1 are varied: w1=0.3 mm (curve 91), w1=0.2 mm (curve 92) and w1=0.1 mm (curve (93). By appropriate choices of the structure dimensions, one may effectuate large enhancements at a frequency of choice. FIG. 10 is just an example; one can optimize the structure to monitor the highest enhancement at the desired frequency within practical limitations.

The effect of trenches 41 and structured trenches 81 to enhance the pressure in elongated membranes or vibrating plates is also present for membranes or plates of different shape. In the case of circular membranes or plates, it is useful to apply spherical structured or unstructured 41, 81. Besides rectangular or circular membrane shapes also other shapes e.g. elliptical, hexagonal shapes etc. could be used. One may similarly use the substrate and/or packaging layers to form the walls of the pits.

In particular embodiments of transducer elements with structured supports according to the present invention, the sidewalls of the supports are piecewise perpendicular to a major surface of the membrane 31, but this is not essential to obtain pressure enhancement. One could also think about a structured trench, where the part of the trench does not have a sidewall perpendicular to the membrane but rather sloped.

In accordance with an additional aspect of the present invention depicted on FIG. 14, an ultrasound array 1400 comprises a plurality of active transducer elements 1401 aligned along one axis X-X. In accordance with this example of embodiment, at each end of the aligned elements, the array further includes a first inactive transducer element 1402 at a first end and a second inactive transducer element 1403 at the second side. Although only one inactive transducer 1402 and 1403 are located each end in this example, it is possible to have a plurality of inactive transducers at each end. This specific arrangement of the array enables to increase the homogeneity of the output frequency of the active elements.

It is to be noted that, to obtain the frequency homogeneity benefits, the use of the specific arrangements of the preceding embodiments are not required and could be obtained with conventional transducer elements, i.e. without the wall arrangements previously explained. However, it is to be understood that the combination of these two aspects of the invention enables a high quality transducer exhibiting high output power and increased frequency homogeneity, which enables small beam width of the transducer array due the homogeneous frequency operation and high output, so that presence detection can be achieved with a small object e.g. human moving with the hand a mouse in a small zone at a large distance. This can be distinguished from another object e.g. human moving with the hand a mouse in a small adjacent zone to the previous zone.

An ultrasound transducer array according to this example of the present invention with high ultrasound output, shows a homogeneous operation frequency for the operating elements, by using next to the operating elements on each side of the transducer array (at least) one additional element, which is not used in the operation. In a conventional array, the outer elements have a resonance frequency that is lower than the resonance frequency of the inner elements. Therefore, the resonance frequency of an array is not homogeneous if all elements of the array are operational. By the application of non-operational outer elements, all operational elements are inner elements of the array and have (very nearly) the same frequency.

The fact that the outer elements have lower resonance frequencies has been found in experiments. In simulations, the resonance frequency of an infinite array of elements that have the experimental support structures 40 and the resonance frequency of an element that is fixed at both sides were compared. Simulation results showed that the element fixed at both sides exhibited a resonance frequency that is 4 kHz lower than the elements in an infinite array.

In fact, an outer element of an array has on one side a support structure 40 between elements and on the other hand the massive support of the substrate part that is included in the package. This massive support will be like a fixation. On the basis of the simulation for an inner element and for an element fixed on both sides, one predicts that the resonance frequency of an outer element, which is fixed at only one side, will be roughly 2 kHz lower than the resonance frequency of an inner element. This is in agreement with experimental results on an ultrasound transducer array with a high accuracy of the operating frequencies of the operating transducer, as shown in the table below. The transducer array of the experiment is similar to the one depicted on FIG. 14. This array comprises 8 piezoelectric thin film operating elements (from 2 to 9) with a height of 3 mm, as described above and on each side one ultrasound transducer element (1 and 10) with a height of 3 mm, that is not used in the operation. As can be seen from the data, the eight operating elements operate at the same frequency. With adding on each side of the array an additional element it is possible to realize an ultrasound transducer array were the 8 elements have an operating frequency which is within an accuracy of 99%.

| Element | Resonance frequency (kHz) |
| --- | --- |
| 1 | 78.8 |
| 2 | 81.3 |
| 3 | 81.4 |
| 4 | 81.4 |
| 5 | 81.4 |
| 6 | 81.4 |
| 7 | 81.4 |
| 8 | 81.4 |
| 9 | 81.4 |
| 10 | 78.8 |

The first example of this embodiment can be extended to a bi-dimensional array, as depicted on FIG. 15A. In this second example, the array 1500 comprises a plurality of active transducer elements 1501 arranged along two dimensions X-X and Y-Y. These transducer elements 1501 are surrounded by a plurality of inactive transducer elements 1502. These inactive transducer elements are aligned with the active elements 1501 along with the directions X-X and Y-Y.

In an alternative shown on FIG. 15B, inactive elements 1502 are only disposed around the active elements along one dimension. Indeed, the inactive elements are only disposed at two of the four edges. Thus, this arrangement permits to increase the frequency homogeneity of the active elements 1501 without requiring a large amount of inactive transducer elements 1502.

In the previous examples, the inactive elements 1402, 1403 and 1502 may be non operational by not providing input electrodes on the inactive elements. It is also possible that the driver of the transducer elements is arranged to output power only to the active transducer elements 1501 and not to the inactive transducer elements 1502.

In a further embodiment next to the active transducers elements, openings 41 are etched into the support Si to realize a homogeneous frequency for the active transducers. In this way no full inactive transducer elements next to the active transducer elements need to be processed but instead only openings 41 in the support next to the active transducer elements.

In order to further improve the homogeneity of the output frequency, it is possible that for each of the inactive elements, a muffling material is provided, for example instead of the metal grids used for protecting the active transducer elements in the above embodiments. Thus, the influence of the inactive elements lower resonance frequency may be diminished.

In another aspect of the present invention, an ultrasound transducer array according to embodiments of the present invention with a high ultrasound output is combined with an audio microphone for reliable presence detection. Hence, according to this aspect of the invention, an array of microphones may be provided, with one (or more) of the elements having also the functionality of detecting in the audible frequency spectrum. Such integration of different sensors (sensor fusion) may be used for detecting one or more parameters reliably. Typically, systems where different types of sensors are combined are very bulky. In the present invention a new concept is proposed, with integrated ultrasound sensor elements according to embodiments of the present invention with a high ultrasound output which are integrated with a microphone element or an array of microphones. The special feature of this embodiment is that the same technology is applied so that ultrasound transducer with high output pressure are combined with microphones. By combining these two features, small, compact and a more reliable system are obtained. Moreover, it will be a less bulky device with small form factor which makes it much more attractive for product designers.

In this aspect of the present invention, a multi-sensor element is described with a plurality of thin-film based ultrasound sensors according to embodiments of the present invention and at least one audio microphone. In a first embodiment, the present aspect provides a solution based on thin-film piezoelectric transducers. This embodiment is illustrated in FIG. 11. The multi-sensor element 100 illustrated comprises an array 10 comprising several ultrasound transducers 11 (in FIG. 11 only 2 are drawn) according to embodiments of the present invention, and one audio microphone 101.

In the embodiment illustrated in FIG. 11, 800 um wide elements 11 generate ultrasound of a frequency ~60-100 kHz. Phase delayed input to these elements 11 facilitates steering of the ultrasound beam. FIG. 12 shows an ultrasound beam profile, which is steered by approx. 45 degree, using the ultrasound transducer array. The array elements arranged in a matrix format (rows and columns) as in FIG. 2a can steer the beam in two directions which can render 2D scanning as well. Next to the array 10, a separate element 101 with larger membrane size is designed for audible sound detection in a passive way.

While the invention has been illustrated and described in detail in the drawings and foregoing description, such illustration and description are to be considered illustrative or exemplary and not restrictive. The invention is not limited to the disclosed embodiments.

In another aspect of the present invention, an ultrasound transducer array according to embodiments of the present invention is the combination of an ultrasound transducer or an array of ultrasound transducers with high output pressures with thin film pyroelectric sensor or pyroelectric sensor array. The embodiment includes a combination of at least one piezoelectric thin film ultrasound transducer and/or an array of piezoelectric transducers with high output of ultrasound, with at least one thin film pyroelectric sensor and/or an array of pyroelectric sensors for detecting infrared radiation (IR). The special feature is that besides the ultrasound device with a high ultrasound output the same technology is applied to integrate the pyroelectric sensor or sensor array. Piezoelectric material may be used for both generation/transmission and reception/detection of ultrasound and IR signals. Of course also different piezoelectric and pyroelectric materials may be applied.

The following shows an illustrative embodiment of combined thin film ultrasound and pyroelectric detectors.

FIG. 13 shows an array of ultrasound transducers and a pyroelectric sensor. Of course, instead of being arranged in an array, the combined ultrasound and pyroelectric transducer may be a standalone detector or used with other detectors in any desired configuration. The ultrasound and/or and pyroelectric sensor, as single element or as array of elements, is processed on top of the membrane, which may be for example silicon nitride or silicon oxide, or silicon oxide, silicon nitride, silicon oxide in any type of stack of in any type of combination. Of course, as in this and other embodiments, any other membrane material such as Si or combinations of membrane stack of Si and silicon oxide (e.g., SiO2) may also be used. The advantage of a silicon oxide nitride layer is the low specific heat and the low thermal conductivity, which increases the thermal time constant of the pyroelectric device, which is the time, by which a temperature enhancement delta T relaxes to its background value. In this example the piezoelectric layer which may be undoped or La or Mn doped lead titanate zirconate is processed on top of the membrane. Between the membrane and the piezoelectric layer a barrier layer may be applied, see above. This piezoelectric layer serves also as pyroelectric sensor material of the pyroelectric detector which is formed and processed next to the ultrasound transducer. The piezoelectric/pyroelectric layer may be patterned to prevent cross talk between the ultrasound transducer elements of the array, as well as between the ultrasound and pyroelectric devices or elements. Top electrodes are applied (similar to electrodes above). Digital electrodes may be Titanium (Ti) and gold (Au). However, other material may also be used for the electrode, such as nickel/chromium (Ni/Cr) electrodes which provide for optimum absorption of IR radiation. The electrodes are patterned to create electrodes for the ultrasound transducers and also the electrodes for the pyroelectric detector devices. Each pyroelectric element may have interdigitated top electrodes. For highest sensitivity they form two sensors. One sensor is illuminated by the infrared light, e.g., via a lens, which is mounted on top of the sensor. The second sensor is located on the substrate and not illuminated. The differential signal indicates any change in the infrared radiation, while slow changes of the ambient temperature are cancelled. An optical system such as Fresnel lenses is included to optimize signals including signal to noise ratios. To prevent heating up of the reference sensor also protection layers can be mounted on the support side underneath the reference sensors.

The change of the temperature of the illuminated pyroelectric element results in a change of the polarization of the pyroelectric element and hence also results in the release of charges at the surface. These charges give rise to a voltage which is read out by a preamplifier which indicates motion (or a change of temperature). As is well known, a lens may be provided in front of the membrane of the pyroelectric element to receive the IR radiation.

For desired operation, different designs are possible. In one version, two pyroelectric elements may be designed in series and have opposite poling. Such a dual element layout may be used to compensate for changes of background temperature, which heats up both elements simultaneously. Besides the dual element design other designs using any desired number of pyroelectric elements may be used, such as four elements or more.

Further devices, circuits and electronics may be provided, such as integrated in the substrate. Electronics such as an amplifier, which may be a FET (Field Effect Transistor) may be mounted separately on a board and wire bonded to the device, comprising the ultrasound transducers and pyroelectric sensors.

Thus, an array of detectors may include only ultrasound detectors, only IR detectors, or a combination of ultrasound and IR detectors using any desired number or combination of detectors, where any desired number of infrared elements may be formed next to ultrasound elements for form a combined arrays which may be used for both ultrasound and infrared transmission, detection and imaging. Such combined ultrasound and IR transducers may be formed by thin film processing, where electrodes may be on the same side or opposite sides of the piezoelectric material, similar to that described above.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A transducer comprising
a membrane configured to change shape in response to a force, the membrane having a first major surface and a second major surface,
a piezoelectric layer formed over the first major surface of the membrane, the piezoelectric layer having an active portion,
first and second electrodes in contact with the piezoelectric layer, wherein an electric field between the first and second electrodes determines mechanical movement of the piezoelectric layer,
support structures at the second major surface of the membrane on adjacent sides of the active portion of the piezoelectric layer (18), at least part of the support structures forming walls perpendicular, or at least not parallel, to the second major surface of the membrane, which define a trench underlying the active portion of the piezoelectric layer (18), and having a shape of a half open pipe with a cross section geometry which matches a resonance condition for an ultrasound wave travelling through the pipe.

2. A transducer according to claim 1, wherein the membrane comprises a silicon oxide layer located over a silicon nitride layer, or the membrane comprises a stack of silicon oxide, silicon nitride, silicon oxide layers, the piezoelectric layer being located over the silicon oxide layer.

3. A transducer according to claim 1, further comprising a barrier layer, the piezoelectric layer or one of the electrode layers being located over the barrier layer.

4. A transducer according to claim 1, further comprising an inorganic layer such as silicon nitride or silicon oxide or an organic layer or a combination of an inorganic and organic layer as protection layer.

5. A transducer according to claim 1, wherein a first part of the trench is provided in a substrate and a second part of the trench is provided in an additional layer on the other side of the said substrate, the additional layer being part of a package.

6. A transducer according to claim 1, wherein trenches form at least two cavities with different sizes in the direction parallel to the second major surface so that the first cavity next to the membrane has a larger volume than the second cavity; the cavities are such that they form a Helmholtz resonator so that the output pressure on the support side is higher than on the other side.

7. A transducer according to claim 6, wherein the support structures are realized in the package, wherein the package is comprised in the group comprising: a plastic package, a ceramic package, a glass package, a silicon package or a combination of silicon and plastic package.

8. A transducer according to claim 6, wherein on the support structure (40) a mesh is located for protecting the transducer from mechanical damage.

9. A transducer according to claim 6, wherein the transducer is mounted on a printed circuit board that comprises a hole where the operating elements are located.

10. A transducer according to claim 9, wherein the transducer is covered on the electrode side (19) with a rigid body from at least one of plastic, ceramic, glass or metal, the rigid body comprising a hole arranged so that the hole does not touch the transducer on the electrode side 19.

11. The transducer of claim 10, wherein the rigid body comprises an absorbing material for ultrasound.

12. An array comprising at least one transducer as claimed in claim 1.

13. An array as in claim 12, furthermore comprising at east one audible sound detector, and/or a least one pyroelectric sensor.

14. An array comprising a plurality of transducers as claimed in claim 1, wherein the array is a matrix of transducers, wherein the matrix of transducers is surrounded with inactive transducers.

15. An array comprising a plurality of transducers as claimed in claim 1, disposed in accordance with an alignment direction, wherein at least one inactive transducer is disposed at an end of the array.

16. An array as claimed in claim 15, wherein the inactive transducers are similar to the other transducers of the array, and the inactive transducers are disconnected from an electric control.

17. An array as claimed in claim 15, wherein the inactive elements comprise muffling means for blocking the output power of the inactive elements.

18. An array as claimed in claim 15, wherein at least one opening (41) is disposed at an end of the array.

19. A transducer according to claim 1, wherein pressure waves are generated at the side of the support structures of the transducer.

* * * * *